US012568597B2

(12) United States Patent
Nayak et al.

(10) Patent No.: US 12,568,597 B2
(45) Date of Patent: Mar. 3, 2026

(54) STAGED HIGH-DENSITY BACKPLANE FOR ELECTRONIC MODULES

(71) Applicant: Western Digital Technologies, Inc., San Jose, CA (US)

(72) Inventors: Shailesh R. Nayak, Bangalore (IN); Arjun Jayaprakash, Bangalore (IN); Joe Paul Moolanmoozha, Bangalore (IN); Nandan Sarjapur Muniswamy, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 273 days.

(21) Appl. No.: 18/237,556

(22) Filed: Aug. 24, 2023

(65) Prior Publication Data

US 2025/0071925 A1 Feb. 27, 2025

(51) Int. Cl.
H05K 7/00 (2006.01)
H05K 7/14 (2006.01)

(52) U.S. Cl.
CPC ......... H05K 7/1409 (2013.01); H05K 7/1404 (2013.01)

(58) Field of Classification Search
CPC ........................... H05K 7/1404; H05K 7/1409
USPC ........................................................ 361/752
See application file for complete search history.

(56) References Cited

U.S. PATENT DOCUMENTS

| | | | |
|---|---|---|---|
| 5,052,936 A | 10/1991 | Biechler et al. | |
| 5,222,897 A | 6/1993 | Collins et al. | |
| 5,626,480 A | 5/1997 | Baumbaugh | |

(Continued)

FOREIGN PATENT DOCUMENTS

| | | |
|---|---|---|
| CN | 102610959 A | 7/2012 |
| EP | 0973098 A1 | 1/2000 |

OTHER PUBLICATIONS

Yu, Wenjie et al., Multi-Objective Optimum Design of High-Speed Backplane Connector Using Particle Swarm Optimization, IEEE Access, / accepted Jun. 5, 2018 / date of publication Jun. 15, 2018 / date of current version Jul. 12, 2018, pp. 35182-35193, vol. 6, 2018, IEEE.

*Primary Examiner* — Zhengfu J Feng
(74) *Attorney, Agent, or Firm* — John D. Henkhaus

(57) ABSTRACT

An electronics backplane assembly includes respective first and second floating backplane connector assemblies each having a backplane connector coupled to a corresponding backplane plate movably coupled with a chassis wall, and a pair of stepped stoppers coupled to the chassis wall and positioned on each side of each backplane plate. Each stepped stopper pair includes a step at a different distance from the chassis wall and positioned to provide a reactive force to the corresponding backplane plate for incrementally engaging respective backplane connectors of an electronics module with a corresponding floating backplane connector. Each floating backplane connector assembly may include a pair of guide stoppers having a stopper structure at respective positions, coupled to the chassis wall and protruding through holes in each backplane plate, where each backplane plate is positioned for connector engagement between the step structure of each stepped stopper and the stopper structure of each guide stopper.

20 Claims, 8 Drawing Sheets

(56) References Cited

U.S. PATENT DOCUMENTS

| | | | | |
|---|---|---|---|---|
| 7,267,568 B2 * | 9/2007 | Baker | ................ | H01R 13/6315 |
| | | | | 439/247 |
| 7,408,788 B2 | 8/2008 | Rubenstein | | |
| 2005/0239310 A1 | 10/2005 | Baker | | |
| 2006/0067063 A1 | 3/2006 | Stahl et al. | | |
| 2008/0045051 A1 | 2/2008 | Sato et al. | | |
| 2011/0116233 A1 * | 5/2011 | Beaudoin | .......... | H05K 7/20581 |
| | | | | 361/679.48 |
| 2015/0173193 A1 * | 6/2015 | Vanderveen | ......... | H01R 12/727 |
| | | | | 361/784 |
| 2015/0200474 A1 * | 7/2015 | Rossman | .............. | H01R 12/91 |
| | | | | 439/64 |
| 2017/0077661 A1 * | 3/2017 | Assif | ..................... | H01R 24/52 |
| 2017/0093065 A1 | 3/2017 | Wang et al. | | |
| 2017/0162966 A1 * | 6/2017 | Vanderveen | ......... | H01R 12/728 |
| 2021/0313720 A1 * | 10/2021 | Tsai | .................... | H05K 7/1492 |

* cited by examiner

FLOATING BACKPLANE
CONNECTOR 1 ENGAGED

FLOATING BACKPLANE
CONNECTOR 2 ENGAGED

FIXED BACKPLANE
CONNECTOR 3 ENGAGED

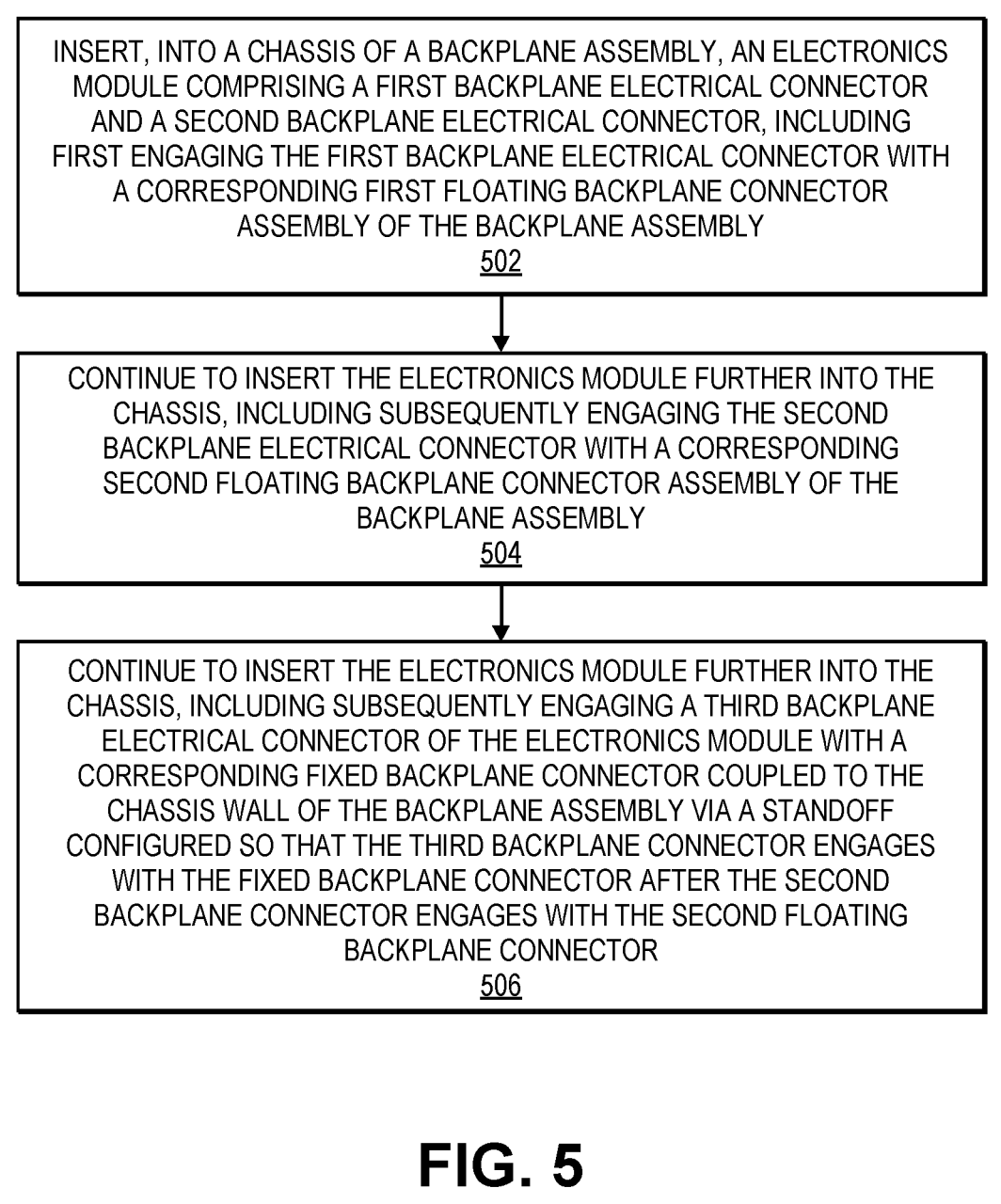

INSERT, INTO A CHASSIS OF A BACKPLANE ASSEMBLY, AN ELECTRONICS
MODULE COMPRISING A FIRST BACKPLANE ELECTRICAL CONNECTOR
AND A SECOND BACKPLANE ELECTRICAL CONNECTOR, INCLUDING
FIRST ENGAGING THE FIRST BACKPLANE ELECTRICAL CONNECTOR WITH
A CORRESPONDING FIRST FLOATING BACKPLANE CONNECTOR
ASSEMBLY OF THE BACKPLANE ASSEMBLY
502

CONTINUE TO INSERT THE ELECTRONICS MODULE FURTHER INTO THE
CHASSIS, INCLUDING SUBSEQUENTLY ENGAGING THE SECOND
BACKPLANE ELECTRICAL CONNECTOR WITH A CORRESPONDING
SECOND FLOATING BACKPLANE CONNECTOR ASSEMBLY OF THE
BACKPLANE ASSEMBLY
504

CONTINUE TO INSERT THE ELECTRONICS MODULE FURTHER INTO THE
CHASSIS, INCLUDING SUBSEQUENTLY ENGAGING A THIRD BACKPLANE
ELECTRICAL CONNECTOR OF THE ELECTRONICS MODULE WITH A
CORRESPONDING FIXED BACKPLANE CONNECTOR COUPLED TO THE
CHASSIS WALL OF THE BACKPLANE ASSEMBLY VIA A STANDOFF
CONFIGURED SO THAT THE THIRD BACKPLANE CONNECTOR ENGAGES
WITH THE FIXED BACKPLANE CONNECTOR AFTER THE SECOND
BACKPLANE CONNECTOR ENGAGES WITH THE SECOND FLOATING
BACKPLANE CONNECTOR
506

FIG. 5

STAGED HIGH-DENSITY BACKPLANE FOR ELECTRONIC MODULES

FIELD OF EMBODIMENTS

Embodiments of the invention may relate generally to electronic equipment and particularly to a gated and staged backplane for ejector-less insertion and extraction of electronic modules.

BACKGROUND

Generally, more complex and feature-rich products are being designed in server, storage, power, and telecommunications industries, for example. In the context of electronics modules, components, printed circuit boards (PCBs) and the like, the increase in features drives the need for increased interconnections within PCBs, as well as a higher number of interconnections needed in response to a higher number of interconnected PCBs. Thus, board-to-board connections are driving the need for using densely-packed electrical connectors.

Furthermore, a trend is developing in the aforementioned industries in which a relatively high number of electrical interconnections are being implemented at the backplane level. A backplane (or backplane system) generally refers to a group of electrical connectors, typically implemented on one or more common or electrically interconnected PCBs, used to connect several electronics modules together (e.g., via their respective printed circuit boards) to make up some type of computing or storage system for example. Backplane architecture has served the electronics industry well for many years, where circuitry embedded in layers of the backplane can create custom point-to-point or broad parallel bus structures, for example, effectively making the backplane a very large connector. Electronics modules that plug into a backplane enable modular system design, along with providing for simpler upgrades and repairs. A backplane can be populated with the same or a variety of different electrical connectors that are designed for specific functions, such as line card, switch, I/O (input/output), or power distribution, making those slots application-specific. This trend of increased backplane connectivity is expected to continue moving forward.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 5 is a flow diagram illustrating a method of incrementally interconnecting an electronics module with a backplane, according to an embodiment.

DETAILED DESCRIPTION

Figure 1A:
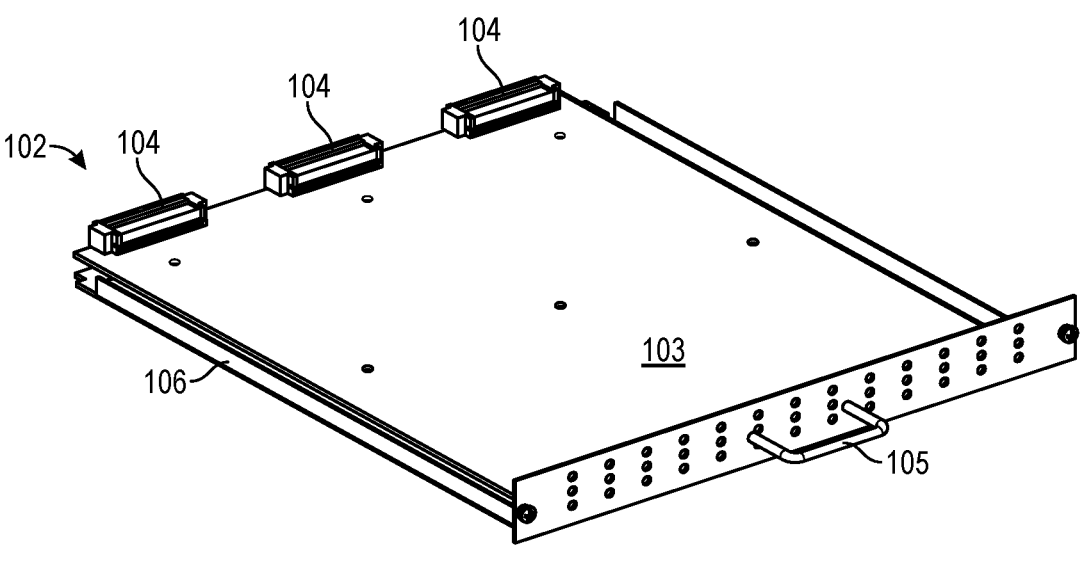
FIG. 1A is a perspective view illustrating an electronics module field replaceable assembly (FRA), according to an embodiment.

Generally, approaches to staged backplane electrical interconnectivity to reduce engagement/disengagement forces are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices are shown in block diagram form to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment or to every embodiment.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the structure is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that a relatively high number of electrical interconnections are being implemented at the backplane level, and that this trend is expected to continue. Consequently, as the number of connections at the backplane increases, the overall connector engagement and disengagement forces associated with all the connectors/connections is expected to increase accordingly. In a conventional approach of board-to-backplane connector connection, the insertion/removal (also engagement/disengagement) force is directly related to the number of contacts in a connector. When there are more contacts, then a higher force is required. In order to mitigate this issue, ejectors are typically used. However, when there is limited space and a higher pin count needs to be added to backplane connectors, then ejectors become challenging to implement. Hence, approaches to efficiently managing engagement/disengagement forces between electronic module connectors and corresponding backplane connectors as experienced by users is considered desirable. For example, reducing the insertion/removal force even if there are more backplane connectors in a design is considered desirable.

Electronics Module Field Replaceable Assembly

FIG. 1A is a perspective view illustrating an electronics module field replaceable assembly (FRA), according to an embodiment. The term "FRA" (also, "replaceable electronics module") generally refers to any electronics module, unit, or modular system or sub-system, typically including a PCB and electronic components, that is designed to be readily interchangeable and removable/replaceable by an operator in the field of use. Typically, removing and/or replacing such a unit includes interconnecting and/or disconnecting FRA electrical connectors with corresponding backplane electrical connectors. As such, the term "electronics module field replaceable assembly" is intended for a broadest reasonable interpretation unlimited by industry, context, implementation, functionality, or the like.

Figure 1B:
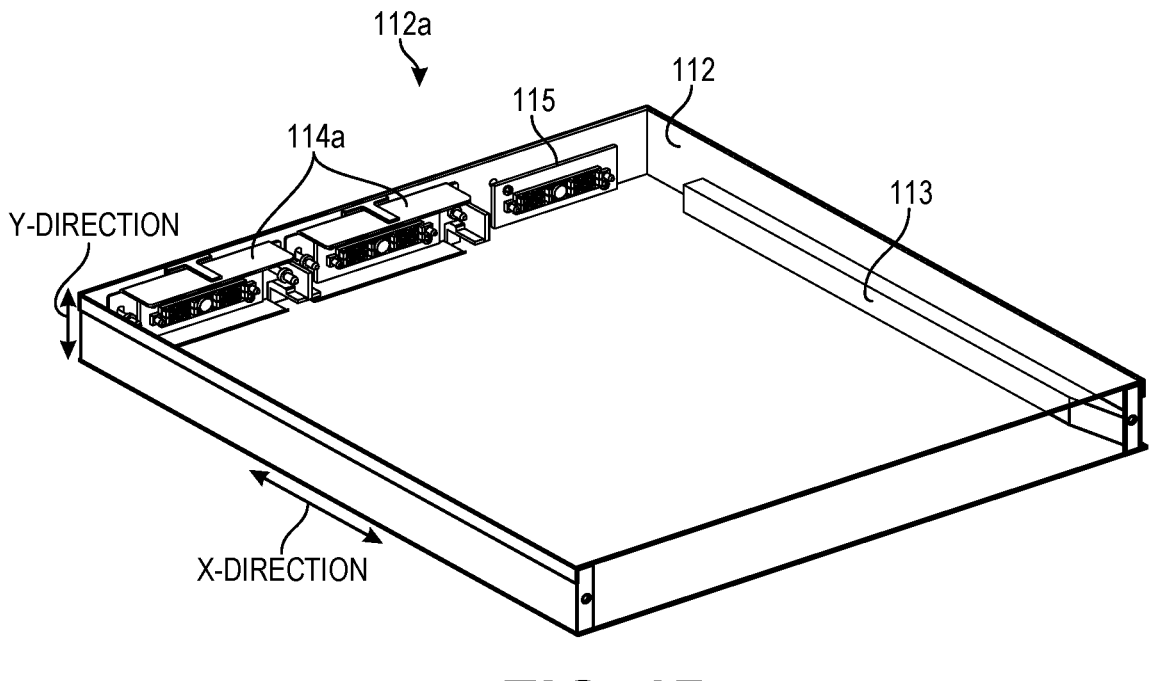
FIG. 1B is a perspective view illustrating an FRA chassis, according to an embodiment.

FRA 102 (or "electronics module 102") comprises a plurality of backplane electrical connectors 104 (or "backplane connectors 104" or simply "connectors 104") electrically and mechanically coupled to a PCB 103, on a carrier plate 106, and configured for engagement and electrical connection with a corresponding floating backplane connector 114 (see, e.g., FIG. 1B). According to an embodiment, FRA 102 further comprises a handle 105 configured to facilitate the physical handling of the FRA 102 by an operator/user. FRA 102 is configured for insertion into an FRA chassis, such as chassis 112 of FIG. 1B.

FIG. 1B is a perspective view illustrating an FRA chassis, according to an embodiment. FRA chassis 112 (or simply, "chassis 112") comprises a plurality of floating backplane electrical connector assemblies 114a (or simply "floating backplane connector assembly 114a") coupled to the chassis 112 and comprising a corresponding floating backplane electrical connector 114 (or "floating backplane connector 114"), and configured for engagement and electrical connection with a corresponding backplane connector 104 of FRA 102. According to an embodiment, chassis 112 further comprises a fixed (i.e., not "floating") backplane connector 115 configured for engagement and electrical connection with a corresponding backplane connector 104 of FRA 102. According to an embodiment, chassis 112 is configured as an enclosure, e.g., a rectangular enclosure having four sides, one back wall, and one open end for insertion of an FRA 102, as depicted. According to an embodiment, chassis 112 further comprises one or more (e.g., a pair of opposing) guide rails 113 configured for facilitating the insertion or sliding of FRA 102 into chassis 112 and the supporting thereof.

Figure 1C:
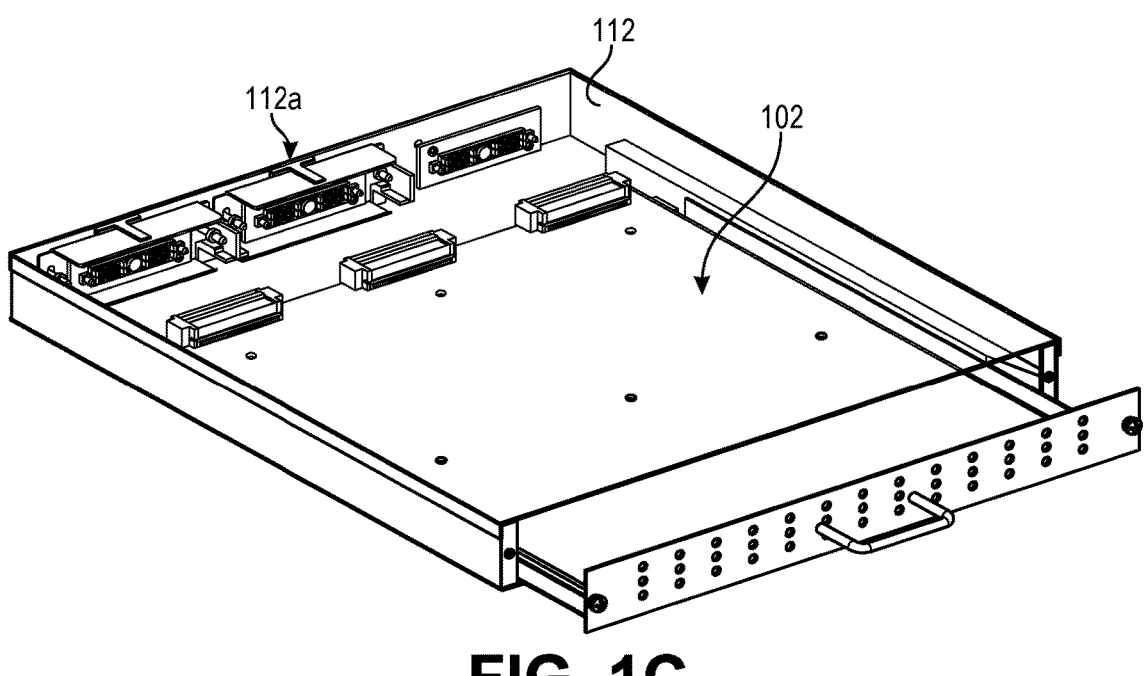
FIG. 1C is a perspective view illustrating the FRA of FIG. 1A inserting into the FRA chassis of FIG. 1B, according to an embodiment.
Figure 1D:
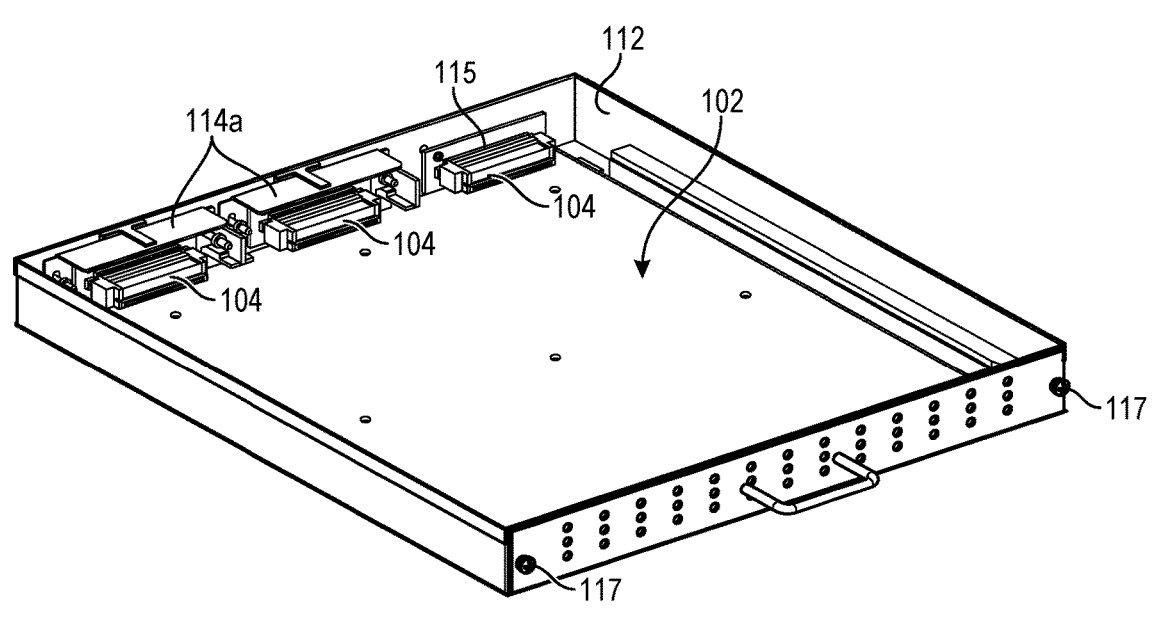
FIG. 1D is a perspective view illustrating the FRA of FIG. 1A completely inserted into the FRA chassis of FIG. 1B, according to an embodiment.

FIG. 1C is a perspective view illustrating the FRA of FIG. 1A inserting into the FRA chassis of FIG. 1B, according to an embodiment. That is, FIG. 1C depicts FRA 102 partially inserted into chassis 112, prior to engagement of backplane connectors 104 with corresponding floating backplane connectors 114 and fixed backplane connector 115, respectively. FIG. 1D is a perspective view illustrating the FRA of FIG. 1A completely inserted into the FRA chassis of FIG. 1B, according to an embodiment. Here, FRA 102 completely inserted into chassis 112, with each backplane connector 104 fully engaged (e.g., mechanically and electrically) with a corresponding floating backplane connectors 114 or fixed backplane connector 115, and whereby captive fasteners 117 may be fastened accordingly. The structural configuration and functionality of the floating backplane connector assemblies 114a of backplane chassis 112 are described in more detail hereafter.

Floating Backplane Connector

Figures 2A, 2B:
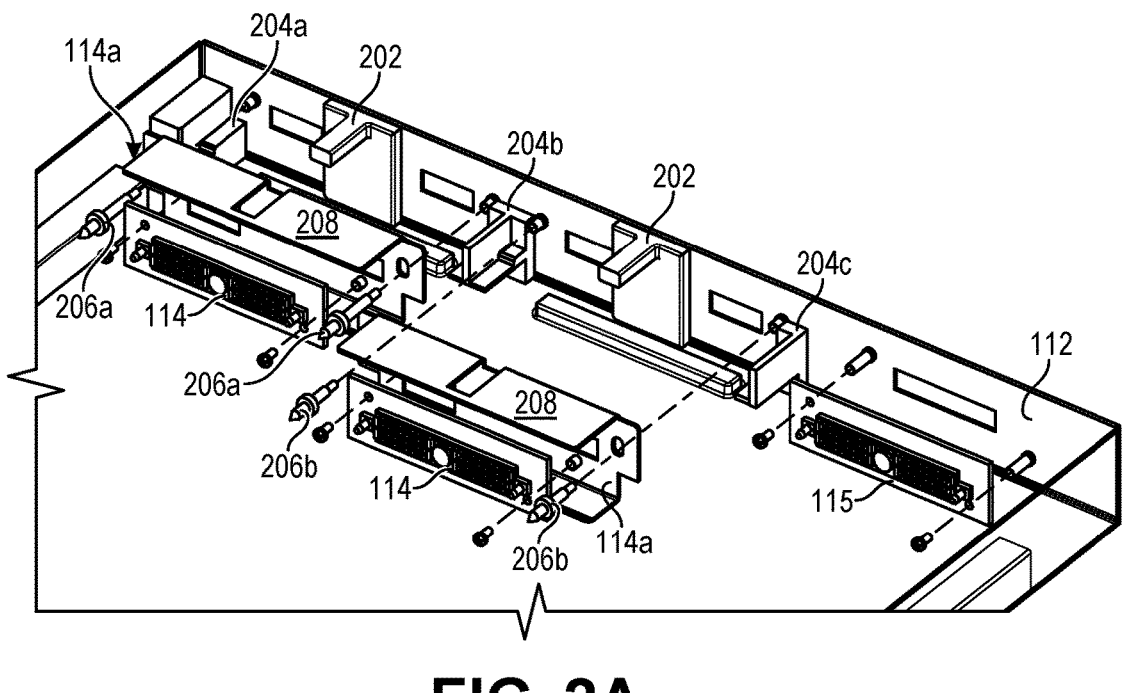
FIG. 2A is a front perspective exploded view illustrating backplane connector assemblies (floating and fixed) of a field replaceable assembly (FRA), according to an embodiment.
FIG. 2B is a top exploded view illustrating the backplane connector assemblies of FIG. 2A, according to an embodiment.

FIG. 2A is a front perspective exploded view illustrating backplane connector assemblies (floating and fixed) of a field replaceable assembly (FRA), and FIG. 2B is a top exploded view illustrating the backplane connector assemblies of FIG. 2A, both according to an embodiment. Each floating backplane connector assembly 114a comprises "floating" or movable parts, along with fixed parts coupled to the chassis 112. While two floating backplane connector assemblies 114a are depicted here for purposes of example, the number of floating backplane connector assemblies 114a constituent to a given backplane assembly 112a may vary from implementation to implementation based, for example, on the design needs and constraints. Each floating backplane connector assembly 114a comprises a corresponding floating backplane connector 114 and a backplane plate 208 movably coupled to the chassis 112 back wall, and to which the corresponding floating backplane connector 114 is coupled. Each floating backplane connector assembly 114a further comprises and a fixed rear stopper 202 coupled to the back wall of chassis 112, whereby each rear stopper 202 also functions as a vertical (y-direction of FIG. 1B) slider for movable parts of the corresponding floating backplane connector assembly 114a.

Each floating backplane connector assembly 114a further comprises a pair of corresponding fixed stepped stoppers 204 coupled to the back wall of chassis 112 on each lateral (i.e., orthogonal to the x-direction and the y-direction of FIG. 1B) side of the backplane plate 208. Here, the stepped stoppers are labeled 204a, 204b, and 204c, where stepped stopper 204b is according to an embodiment constructed as a single part comprising stepped stoppers 204b-1 for one (left) floating backplane connector assembly 114a and 204b-2 for the other (right) floating backplane connector assembly 114a. However, the single part stepped stopper 204b as depicted may alternatively be constructed as separate parts (e.g., stepped stoppers 204b-1, 204b-2), each coupled to the back wall of chassis 112. Regardless, each first stepped stopper 204a, 204b-1 corresponding to the first (left) floating backplane connector assembly 114a comprises a first step structure at a particular first distance from the chassis 112 back wall, and which divides each first stepped stopper 204a, 204b-1 into an engaging portion $204a_e$ (lower portion farthest from back wall) and a fully-mated portion $204a_f$ (higher portion closest to back wall). Similarly, each second stepped stopper 204b-2, 204c corresponding to the second (right) floating backplane connector assembly 114a comprises a second step structure at a particular second distance from the chassis 112 back wall, and which divides each second stepped stopper 204b-2, 204c into an engaging portion $204c_e$ (lower portion farthest from back wall) and a fully-mated portion $204c_f$ (higher portion closest to back wall). As such, each fully-mated portion of each stepped stopper 204a-204c is a greater distance from a floor of the chassis 112 than each corresponding engaging portion of the stepped stopper. Notably, the first distance of the first stepped stoppers 204a, 204b-1 corresponding to the first floating backplane connector assembly 114a is different from the second distance of the second stepped stoppers 204b-2, 204c corresponding to the second floating backplane connector assembly 114a, the function of which is described in more detail elsewhere herein.

Each floating backplane connector assembly 114a further comprises a pair of corresponding guide stoppers 206a, 206b, respectively, coupled to the back wall of chassis 112 on each side of a corresponding floating backplane connector 114, and protruding through respective holes in the corresponding backplane plate 208. Each first guide stopper 206a corresponding to the first (left) floating backplane connector assembly 114a comprises a first stopper structure 206a-1 at a particular first position along guide stopper 206a. Similarly, each second guide stopper 206b corresponding to the second (right) floating backplane connector assembly 114a comprises a second stopper structure 206b-1 at a particular second position along guide stopper 206b. Notably, the first distance between the chassis 112 wall and the first position of each first stopper structure 206a-1 is different from a second distance between the chassis 112 wall and the second position of each second stopper structure 206b-1, the function of which is described in more detail elsewhere herein.

Figure 2C:
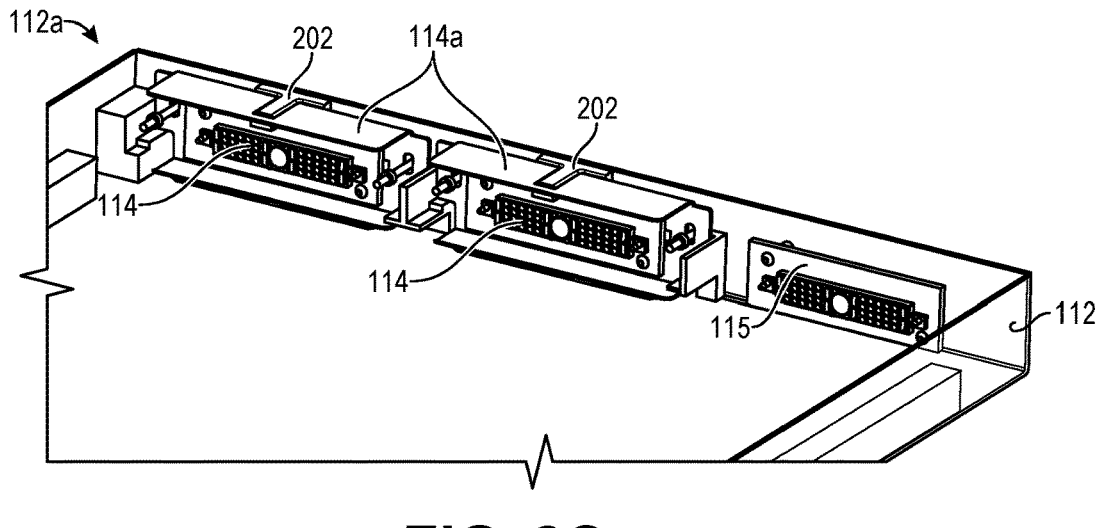
FIG. 2C is a front perspective assembled view illustrating a fully assembled backplane assembly, according to an embodiment.
Figure 2D:
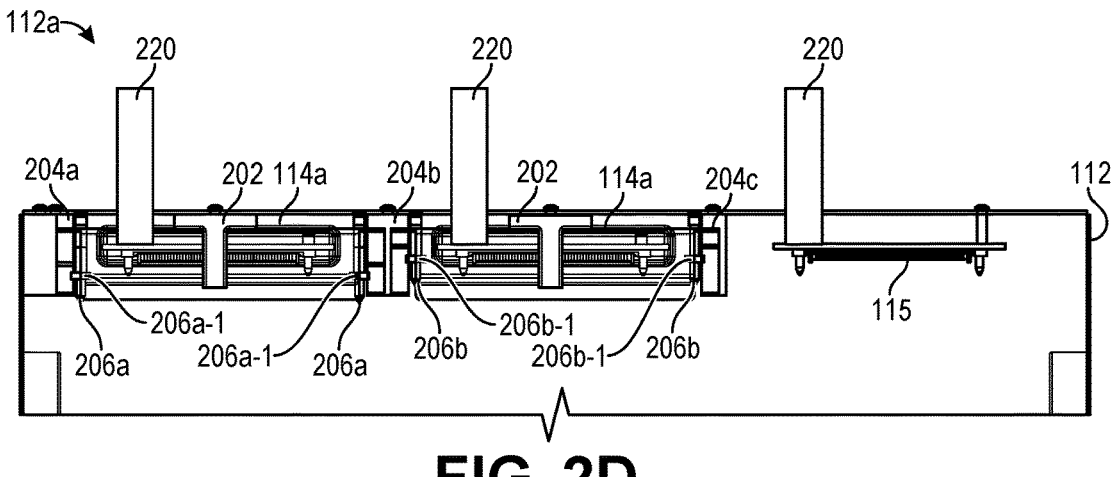
FIG. 2D is a top assembled view illustrating the fully assembled backplane assembly of FIG. 2C, according to an embodiment.
Figure 2E:
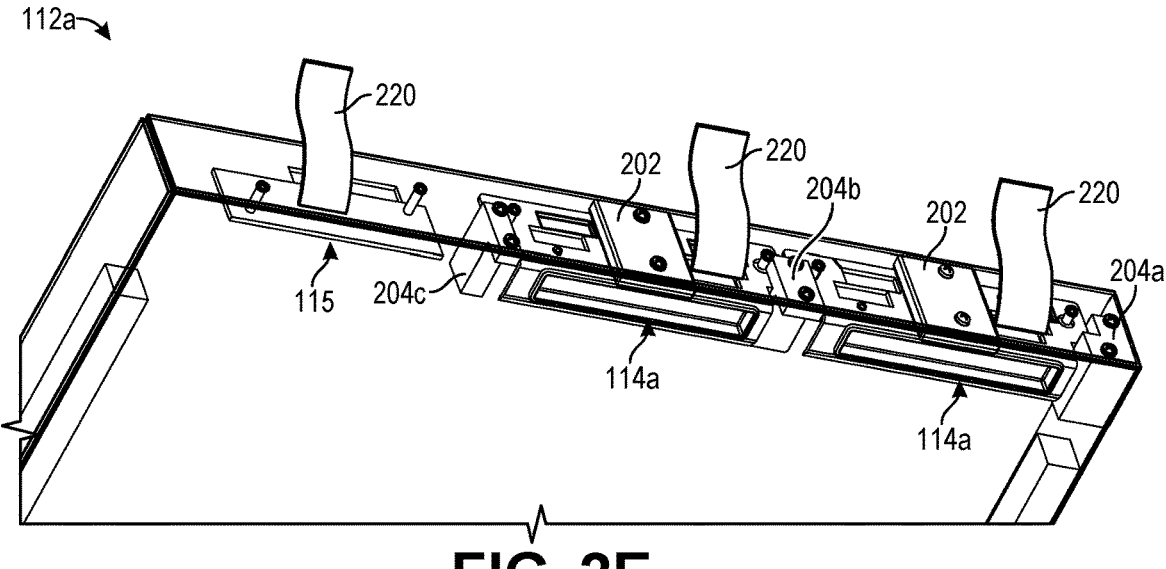
FIG. 2E is a bottom perspective assembled view illustrating the fully assembled backplane assembly of FIG. 2C, according to an embodiment.

FIG. 2C is a front perspective assembled view illustrating a fully assembled backplane assembly, FIG. 2D is a top assembled view illustrating the fully assembled backplane assembly of FIG. 2C, and FIG. 2E is a bottom perspective assembled view illustrating the fully assembled backplane assembly of FIG. 2C, all according to an embodiment. That is, each of FIGS. 2C-2E illustrates a different view of a fully assembled backplane assembly 112a (see also, e.g., FIG. 1B), including a plurality of floating backplane connector assemblies 114a each comprising a floating backplane connector 114, along with a fixed backplane connector 115, all coupled to the chassis 112. While the floating backplane connector assemblies 114a are shown in a position flush with the back wall of chassis 112, the floating backplane connector assemblies 114a are positioned otherwise for staged engagement with respective backplane connectors 104 of FRA 102 (see, e.g., FIGS. 1A, 1C, 1D), as described in more detail elsewhere herein. Another part introduced here is a plurality of flexible electrical cables 220 (e.g., flexible circuit assembly (FCA)) for external electrical connection of the floating and fixed backplane connectors 114, 115 of backplane assembly 112a to an external component.

FRA-Backplane Connector Engagement

The foregoing floating backplane connector assemblies 114a of backplane assembly 112a (see, e.g., FIGS. 2C-2E) are configured so that engagement of the corresponding backplane connectors 104 of the electronics module 102 (see, e.g., FIGS. 1A, 1C, 1D) is performed in a staged or incremental manner, i.e., all backplane connectors 104 are not engaged simultaneously or concurrently. Thus, the insertion/removal (or engagement/disengagement) force is reduced, thereby enabling a better operator/user experience.

Figures 3A, 3B:
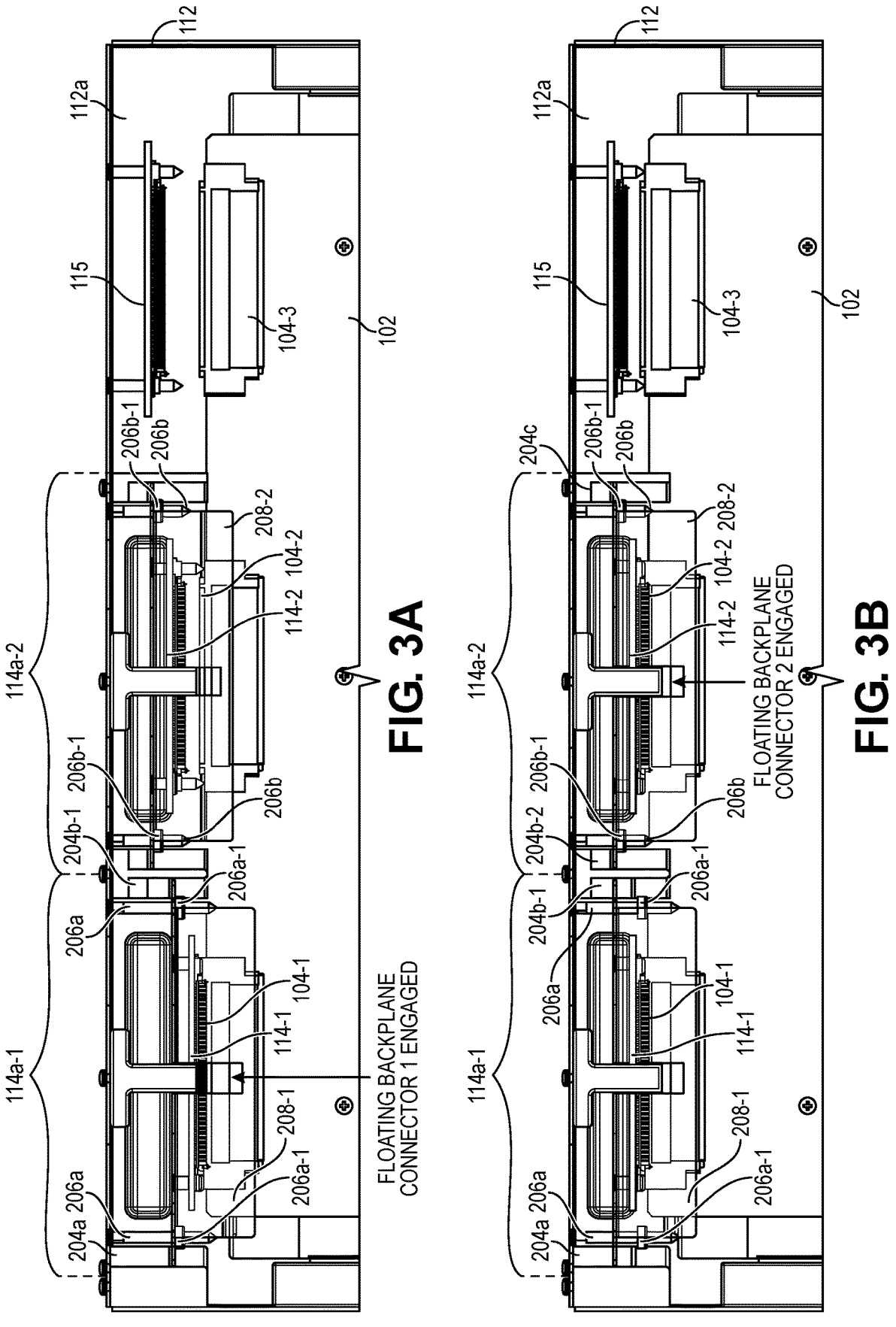
FIG. 3A is a top view illustrating FRA first connector engagement with floating backplane connector, according to an embodiment.
FIG. 3B is a top view illustrating FRA second connector engagement with floating backplane connector, according to an embodiment.

FIG. 3A is a top view illustrating FRA first connector engagement with floating backplane connector, according to an embodiment. Here, the floating backplane connector assemblies are distinguished by labeling as a first floating backplane connector assembly 114a-1 and a second floating backplane connector assembly 114a-2, with corresponding constituent and associated components distinguished by label similarly. Further, the component layers are all depicted with solid lines rather than phantom or dashed lines for the inner components, for purposes of clarity. Note that prior to insertion, the first backplane plate 208-1 is positioned, for engagement with the first backplane connector 104-1 of replaceable electronics module 102 insertable into the chassis 112, adjacent to the first step structure and on the engaging portion (e.g., $204a_e$ of FIG. 2B) of each first stepped stopper 204a, 204b-1. Similarly, the second backplane plate 208-2 is positioned, for engagement with the second backplane connector 104-2 of replaceable electronics module 102, adjacent to the second step structure and on the engaging portion (e.g., $204c_e$ of FIG. 2B) of each second stepped stopper 204b-2, 204c.

Thus, each respective step structure of each stepped stopper 204a-204c is positioned to provide a reactive force to the respective backplane plate 208-1, 208-2 for engaging the respective backplane connector 104-1, 104-2 of the electronics module 102 with the corresponding floating backplane connector 114-1, 114-2. As such, each engaging portion of each stepped stopper 204a-204c supports the respective backplane plate 208-1, 208-2 while the respective backplane connector 104-1, 104-2 is engaging with the corresponding floating backplane connector 114-1, 114-2, and each fully-mated portion (e.g., $204a_f$, $204c_f$ of FIG. 2B) supports the respective backplane plate 208-1, 208-2 while the respective backplane connector 104-1, 104-2 is fully mated with the corresponding floating backplane connector 114-1, 114-2. This is because when a respective backplane connector 104-1, 104-2 is fully mated with its corresponding floating backplane connector 114-1, 114-2, each corresponding stepped stopper 204a-204c becomes disengaged as the carrier plate 106 of the electronics module 102 pushes the respective backplane plate 208-1, 208-2 in the y-direction, over each respective stepped structure and up onto the fully-mated portion of the respective stepped stopper 204a-204c. According to an embodiment, disengagement of each backplane plate 208-1, 208-2 from its corresponding stepped stoppers 204a-204c may be activated/actuated or assisted by other means (e.g., not strictly mechanical), such as by electrical, hydraulic, pneumatic, or some combination of the same.

As previously noted, the first distance of the first stepped stoppers 204a, 204b-1 corresponding to the first floating backplane connector assembly 114a-1 is different from the second distance of the second stepped stoppers 204b-2, 204c corresponding to the second floating backplane connector assembly 114a-2. According to an embodiment, the first distance is greater than the second distance, such that the first backplane connector 104-1 of the electronics module 102 engages with the corresponding first floating backplane connector 114-1 before the second backplane connector 104-2 of the electronics module 102 engages with the corresponding second floating backplane connector 114-2. Note here the current distance between floating backplane connector 114-2 and corresponding backplane connector 104-2. Thus, only enough insertion/engagement force is necessary to engage the first interconnection at this point in the insertion process, with the employment of traditional ejectors foregone or avoided. However, the relative positions of the stepped structures of the stepped stoppers 204a-204c may vary from implementation to implementation and, therefore, such structural arrangements may be implemented to stage the interconnections in a different order, e.g., not necessarily from left to right as illustrated and described as an example herein.

Referring now back to the guide stoppers 206a, 206b, note that prior to insertion the first backplane plate 208-1 is positioned, for engagement with the first backplane connector 104-1 of replaceable electronics module 102, on the engaging portion (e.g., 204a_e of FIG. 2B) of each first stepped stopper 204a, 204b-1 between the first step structure of each first stepped stopper 204a, 204b-1 and the first stopper structure 206a-1 of each first guide stopper 206a. Similarly, prior to insertion the second backplane plate 208-2 is positioned, for engagement with the second backplane connector 104-2 of replaceable electronics module 102, on the engaging portion (e.g., 204c_e of FIG. 2B) of each second stepped stopper 204b-2, 204c between the second step structure of each second stepped stopper 204b-2, 204c and the second stopper structure 206b-1 of each first guide stopper 206b. Each stopper structure 206a-1, 206b-1 is configured and positioned as a limiter on the x-direction mobility of its corresponding floating backplane connector assembly 114a-1, 114a-2, and functions in conjunction with the stepped stoppers 204a-204c to stage the electrical interconnection process. As previously noted, the first distance between the chassis 112 wall and the first position of each first stopper structure 206a-1 is different from a second distance between the chassis 112 wall and the second position of each second stopper structure 206b-1. As depicted and according to an embodiment, first stopper structure 206a-1 is farther from the chassis 112 back wall (i.e., closer to the incoming FRA 102) than the second stopper structure 206b-1. Thus, the first backplane plate 208-1 is positioned to engage first with its corresponding backplane connector 104-1 of the electronics module 102. Likewise according to this embodiment, second stopper structure 206b-1 is closer to the chassis 112 back wall (i.e., farther from the incoming FRA 102) than the first stopper structure 206a-1 and is, therefore, positioned to engage next with its corresponding backplane connector 104-2 of the electronics module 102. However, the relative positions of the stopper structures 206a-1, 206b-1 of the guide stoppers 206a, 206b may vary from implementation to implementation and, therefore, such structural arrangements may be implemented to stage the interconnections in a different order, e.g., not necessarily from left to right as illustrated and described as an example herein.

FIG. 3B is a top view illustrating FRA second connector engagement with floating backplane connector, according to an embodiment. Here, in relation to FIG. 3A, electronics module 102 is inserted further into the chassis 112 of backplane assembly 112a. FIG. 3B depicts the second floating backplane connector assembly 114a-2 now engaged with its corresponding backplane connector 104-2 of electronics module 102, according to as described elsewhere herein with respect to the first floating backplane connector assembly 114a-1 and backplane connector 104-1. Furthermore, the now fully engaged interconnected assembly of the first floating backplane connector assembly 114a-1 and backplane connector 104-1 is further on course toward the back wall of chassis 112, supported by the fully-mated portions of stepped stoppers 204a, 204b-1. Here too the engaging portions (e.g., 204c_e of FIG. 2B) of each stepped stopper 204b-2, 204c supports backplane plate 208-2 while backplane connector 104-2 is engaging with the corresponding floating backplane connector 114-2, and each fully-mated portion (e.g., 204c_f of FIG. 2B) will support backplane plate 208-2 responsive to the respective backplane connector 104-2 fully mating with floating backplane connector 114-2. According to an embodiment, this is again because when backplane connector 104-2 is fully mated with its floating backplane connector 114-2, each corresponding stepped stopper 204b-2, 204c becomes disengaged as the carrier plate 106 of the electronics module 102 pushes backplane plate 208-2 in the y-direction, over the stepped structures and up onto the fully-mated portion of stepped stoppers 204b-2, 204c.

Figure 3C:
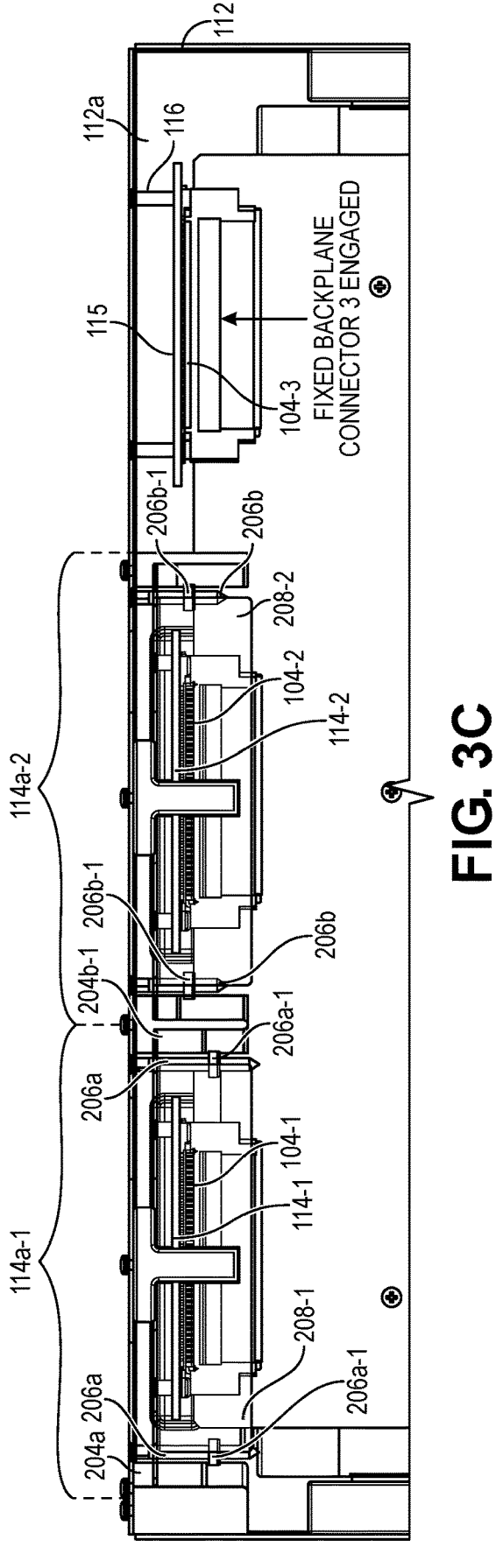
FIG. 3C is a top view illustrating FRA third connector engagement with fixed backplane connector, according to an embodiment.

FIG. 3C is a top view illustrating FRA third connector engagement with fixed backplane connector, according to an embodiment. According to an embodiment, backplane assembly 112a further comprises a fixed backplane connector 115 coupled to the chassis 112 back wall, e.g., via an attachment standoff 116, configured such that a third backplane connector 104-3 of the electronics module 102 engages with the fixed backplane connector 115 after the second backplane connector 104-2 of the electronics module 102 engages with the corresponding second floating backplane connector 114-2 (see, e.g., FIG. 3B). Preferably, any fixed backplane connector is staged to be the subject of the final interconnection made, i.e., after all the floating backplane connectors are engaged and mated incrementally. Here again, because each first and second backplane connector 104-1, 104-2 is already fully mated with its corresponding floating backplane connector 114-1, 114-2, the insertion/engagement force needed to interconnect backplane connector 104-3 of electronics module 102 with the fixed backplane connector 115 is only enough to engage this fixed interconnection at this point in the insertion process, and with the employment of traditional ejectors foregone or avoided. With FIG. 3C, in relation to FIG. 3B, electronics module 102 is inserted further into the chassis 112 of backplane assembly 112a and the fixed backplane connector 115 now engaged with its corresponding backplane connector 104-3 of electronics module 102. Once fully mated, the captive fasteners 117 (FIG. 1D) on the chassis 112 may be tightened to firmly secure all the connectors.

Regarding disengaging electronics module 102 from backplane assembly 112, the reverse of the foregoing described process would occur. That is, once the captive fasteners 117 are loosened and electronics module 102 is pulled away along the x-direction, backplane connector 104-3 of electronics module 102 is the first to disengage from its corresponding fixed connector 115 of backplane assembly 112, followed by the backplane connector 104-2 from floating backplane connector 114-2, and then in turn the backplane connector 104-1 from floating backplane connector 114-1, all the while only needing enough force to disengage each respective interconnection in an incremental manner and order. Likewise and similarly to the reverse of the insertion process, here too each fully-mated portion (e.g., 204$c_f$ of FIG. 2B) of each stepped stopper 204$b$-2, 204$c$ supports backplane plate 208-2 while backplane connector 104-2 is still engaged and while disengaging with floating backplane connector 114-2 and the engaging portions (e.g., 204$c_e$ of FIG. 2B) of each stepped stopper 204$b$-2, 204$c$ supports backplane plate 208-2 once backplane connector 104-2 is disengaged, and so on with backplane connector 104-1 disengaging from floating backplane connector 114-1. Furthermore, the stopper structures of each guide stopper 206$a$, 206$b$ limits the x-direction travel of each respective backplane plate 208-1, 208-2, in the direction of the chassis 112 opening, such that each floating backplane connector assembly 114$a$-1, 114$a$-2 is configured and positioned for insertion and engagement of another electronics module 102. That is, the first backplane plate 208-1 is again positioned adjacent to the first step structure and on the engaging portion (e.g., 204$a_e$ of FIG. 2B) of each first stepped stopper 204$a$, 204$b$-1 between the first step structure and the first stopper structure 206$a$-1 of each first guide stopper 206$a$, and the second backplane plate 208-2 is positioned adjacent to the second step structure and on the engaging portion (e.g., 204$c_e$ of FIG. 2B) of each second stepped stopper 204$b$-2, 204$c$ between the second step structure and the second stopper structure 206$b$-1 of each second guide stopper 206$b$.

Figures 4A, 4B:
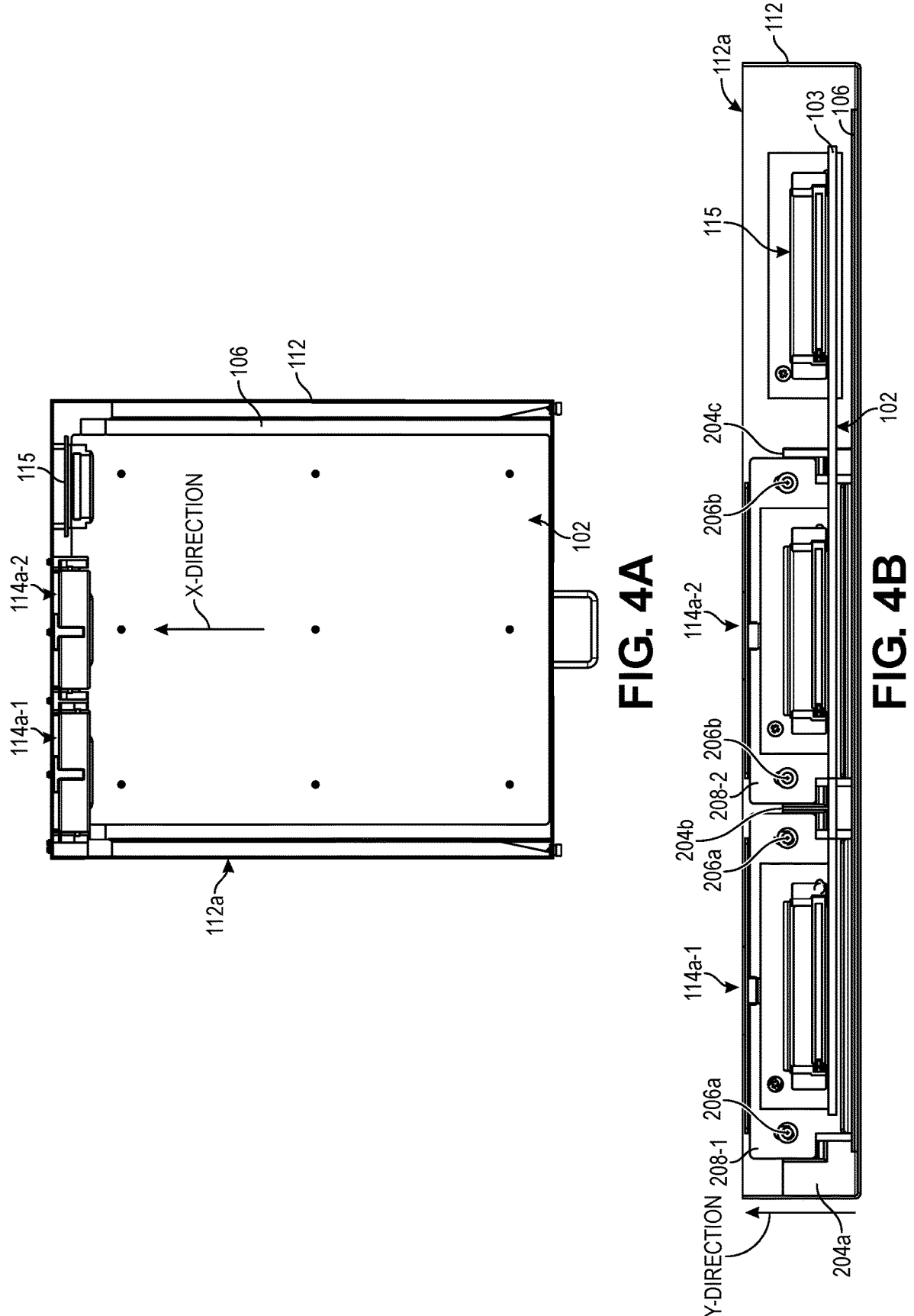
FIG. 4A is a top assembled view illustrating an engaged FRA-backplane assembly, according to an embodiment.
FIG. 4B is a front view illustrating engaged connectors of the FRA-backplane assembly of FIG. 4A, according to an embodiment.

FIG. 4A is a top assembled view illustrating an engaged FRA-backplane assembly, and FIG. 4B is a front view illustrating engaged connectors of the FRA-backplane assembly of FIG. 4A, both according to an embodiment. FIGS. 4A-4B illustrate electronics module 102 (e.g., field replaceable), including carrier plate 106, fully inserted into and with electrical connectors engaged with backplane assembly 112$a$. As such, each of the backplane connectors 104 (see, e.g., FIG. 1A) of electronics module 102 is fully mated with (i.e., electrically and mechanically connected) corresponding floating backplane connector assemblies 114$a$-1, 114$a$-2 (see also floating backplane connector assemblies 114$a$ of FIGS. 1B, 1D) and the fixed backplane connector 115 of backplane assembly 112$a$. FIG. 4B further illustrates the positioning and interrelation of each backplane plate 208-1, 208-2 of respective floating backplane connector 114$a$-1, 114$a$-2 with corresponding stepped stopper 204$a$, 204$b$, 204$c$ and guide stopper 206$a$, 206$b$ (see also FIGS. 3A-3B), the interoperation of which enables the staged engagement/disengagement of the electrical interconnections such that FRA insertion/removal forces are managed (e.g., reduced from alternative arrangements).

The modularity of the foregoing backplane assembly 112$a$ and associated structure and structural relationships enables scalability. That is, multiple backplane assemblies such as backplane assembly 112$a$ may be implemented together, e.g., side-by-side and/or on top of each other, to form a larger system backplane, while the flexible electrical cables 220 can be utilized for connection to a common circuit board or boards.

Method of Incrementally Interconnecting Electronics Module with Backplane

FIG. 5 is a flow diagram illustrating a method of incrementally interconnecting an electronics module with a backplane, according to an embodiment. For example, the method of FIG. 5 may be used to electrically and mechanically interconnect electronics module 102 (e.g., FIG. 1A) with backplane assembly 112$a$ (e.g., FIG. 1B).

At block 502, insert, into a chassis of a backplane assembly, an electronics module comprising a first backplane electrical connector and a second backplane electrical connector, including first engaging the first backplane electrical connector with a corresponding first movable ("floating") backplane connector assembly of the backplane assembly. For example, first engaging a first backplane connector 104-1 (e.g., FIG. 3A) with the first floating backplane connector assembly 114$a$-1 (e.g., FIG. 3A) is enabled at least in part by engaging with a first floating backplane connector assembly 114$a$-1 comprising (i) a first backplane plate 208-1 (e.g., FIG. 3A) movably coupled with a chassis wall 112 (e.g., FIG. 3A) and with which a first floating backplane connector 114-1 (e.g., FIG. 3A) is coupled, and (ii) a pair of first stepped stoppers 204$a$, 204$b$-1 (e.g., FIG. 3A) coupled to the chassis wall 112 and positioned on each lateral side of the first backplane plate 208-1, each first stepped stopper 204$a$, 204$b$-1 comprising a first step structure at a particular first distance from the chassis wall and dividing each first stepped stopper 204$a$, 204$b$-1 into a lower engaging portion 204$a_e$ (e.g., FIG. 2B) and a higher fully-mated portion 204$a_f$ (e.g., FIG. 2B). As such, the first backplane plate 208-1 is initially positioned adjacent to the first step structure and on the engaging portion 204$a_e$ of each first stepped stopper 204$a$ so that the first step structure provides a reactive force to the first backplane plate 208-1 for engaging the first backplane connector 104-1 with the corresponding first floating backplane connector 114-1.

At block 504, continue to insert the electronics module further into the chassis, including subsequently engaging the second backplane electrical connector with a corresponding second movable ("floating") floating backplane connector assembly of the backplane assembly. For example, subsequently engaging the second backplane connector 104-2 (e.g., FIG. 3B) with the second floating backplane connector assembly 114$a$-2 (e.g., FIG. 3B) is enabled at least in part by engaging with a second floating backplane connector assembly comprising (i) a second backplane plate 208-2 (e.g., FIG. 3B) movably coupled with the chassis wall 112 and with which a second floating backplane connector 114-2 (e.g., FIG. 3B) is coupled, and (ii) a pair of second stepped stoppers 204$b$-2, 204$c$ (e.g., FIG. 3B) coupled to the chassis wall 112 and positioned on each lateral side of the second backplane plate 208-2, each second stepped stopper 204$b$-2, 204$c$ comprising a first step structure at a particular second distance from the chassis wall 112 and dividing each second stepped stopper into a lower engaging portion 204$c_e$ (e.g., FIG. 2B) and a higher fully-mated portion 204$c_f$ (e.g., FIG. 2B). As such, the second backplane plate 208-2 is initially positioned adjacent to the second step structure and on the engaging portion 204$c_e$ of each second stepped stopper 204$b$-2, 204$c$ so that the second step structure provides a reactive force to the second backplane plate 208-2 for engaging the second backplane connector 104-2 with the corresponding second floating backplane connector 114-2. At least in part because the first distance of each first stepped stopper 204$a$, 204$b$-1 is greater than the second distance of each second stepped stopper 204$b$-2, 204$c$, the first backplane connector 104-1 engages with the first floating backplane connector 114-1 before the second backplane connector 104-2 of the electronics module 102 engages with the second floating backplane connector 114-2.

As described elsewhere herein, according to an embodiment the first floating backplane connector assembly 114*a*-1 further comprises a pair of first guide stoppers 206*a* coupled to the chassis wall 112 and protruding through respective holes in the first backplane plate 208-1, with each first guide stopper 206*a* comprising a first stopper structure 206*a*-1 (e.g., FIG. 3A) at a particular first position along each first guide stopper 206*a*, and the second floating backplane connector assembly 114*a*-2 further comprises a pair of second guide stoppers 206*b* coupled to the chassis wall 112 and protruding through respective holes in the second backplane plate 208-2, with each second guide stopper 206*b* comprising a second stopper structure 206*b*-1 (e.g., FIG. 3B) at a particular second position along each second guide stopper 206*b*, where a first distance between the chassis wall 112 and the first position of each first stopper structure 206*a*-1 is different from a second distance between the chassis wall 112 and the second position of each second stopper structure 206*b*-1. Accordingly, the first backplane plate 208-1 is positioned for engagement with the first backplane connector 104-1 of the electronics module 102 on the engaging portion 204*a_e* of each first stepped stopper 204*a*, 204*b*-1 between the first step structure of each first stepped stopper 204*a*, 204*b*-1 and the first stopper structure 206*a*-1 of each first guide stopper 206*a*. Likewise, the second backplane plate 208-2 is positioned for engagement with the second backplane connector 104-2 of the electronics module 102 on the engaging portion 204*a_e* of each second stepped stopper 204*b*-2, 204*c* between the second step structure of each second stepped stopper 204*b*-2, 204*c* and the second stopper structure 206*b*-1 of each second guide stopper 206*b*. Thus, at least in part because the first distance corresponding to the first guide stopper 206*a* is greater than the second distance corresponding to the second stopper guide stopper 206*b*, the first backplane connector 104-1 of the electronics module 102 engages with the corresponding first floating backplane connector 114-1 before the second backplane connector 104-2 of electronics module 102 engages with the corresponding second floating backplane connector 114-2.

Generally operating in reverse from the foregoing insertion/interconnection process and according to an embodiment, removing electronics module 102 from the chassis 112 includes first disengaging the second backplane connector 104-2 from the second movable backplane connector assembly 114-2, and subsequently disengaging the first backplane connector 104-1 from the first movable backplane connector assembly 114-1.

At block 506, continue to insert the electronics module further into the chassis, including subsequently engaging a third backplane electrical connector of the electronics module with the corresponding fixed backplane connector coupled to the chassis wall of the backplane assembly via a standoff configured so that the third backplane connector engages with the fixed backplane connector after the second backplane connector engages with the second floating backplane connector. For example, each standoff 116 is configured so that the third backplane connector 114-3 (e.g., FIG. 3C) engages with the fixed backplane connector 115 (e.g., FIG. 3C) after the second backplane connector 104-2 engages with the second floating backplane connector 114-2. Thus, the staged engagement/disengagement of the electrical interconnections 104-1/114-1, 104-2/114-1, 104-3/115 are such that electronics module 102 insertion/removal forces are managed (e.g., less than alternative arrangements).

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A backplane assembly comprising:
a first floating backplane connector assembly comprising:
   a first floating backplane connector,
   a first backplane plate, with which the first floating backplane connector is coupled, movably coupled with a chassis wall, and
   a pair of first stepped stoppers coupled to the chassis wall and positioned on each lateral side of the first backplane plate, each first stepped stopper comprising a first step structure at a particular first distance from the chassis wall and dividing each first stepped stopper into engaging and fully-mated portions; and
a second floating backplane connector assembly comprising:
   a second floating backplane connector,
   a second backplane plate, with which the second floating backplane connector is coupled, movably coupled with the chassis wall, and
   a pair of second stepped stoppers coupled to the chassis wall and positioned on each lateral side of the second backplane plate, each second stepped stopper comprising a second step structure at a particular second distance from the chassis wall and dividing each second stepped stopper into engaging and fully-mated portions;
   wherein the first distance of each first step structure is different from the second distance of each second step structure.

2. The backplane assembly of claim 1, wherein:
each fully-mated portion of each stepped stopper is a greater distance from a floor of the chassis than each corresponding engaging portion of the stepped stopper;
the first backplane plate is positioned, for engagement with a first backplane connector of a replaceable electronics module insertable into the chassis, adjacent to the first step structure and on the engaging portion of each first stepped stopper; and the second backplane plate is positioned, for engagement with a second backplane connector of the electronics module, adjacent to the second step structure and on the engaging portion of each second stepped stopper.

3. The backplane assembly of claim 2, wherein:
each first step structure is positioned such that:
the first step structure provides a reactive force to the first backplane plate for engaging the first backplane connector of the electronics module with the corresponding first floating backplane connector,
the engaging portion supports the first backplane plate while the first backplane connector is engaging with the corresponding first floating backplane connector, and
the fully-mated portion supports the first backplane plate while the first backplane connector is fully mated with the corresponding first floating backplane connector; and
each second step structure is positioned such that:
the second step structure provides a reactive force to the second backplane plate for engaging the second backplane connector of the electronics module with the corresponding second floating backplane connector,
the engaging portion supports the second backplane plate while the second backplane connector is engaging with the corresponding second floating backplane connector, and
the fully-mated portion supports the second backplane plate while the second backplane connector is fully mated with the corresponding second floating backplane connector.

4. The backplane assembly of claim 2, wherein:
the first distance is greater than the second distance, such that the first backplane connector of the electronics module engages with the corresponding first floating backplane connector before the second backplane connector of the electronics module engages with the corresponding second floating backplane connector.

5. The backplane assembly of claim 4, further comprising:
a fixed backplane connector coupled to the chassis wall via an attachment standoff configured such that a third backplane connector of the electronics module engages with the fixed backplane connector after the second backplane connector of the electronics module engages with the corresponding second floating backplane connector.

6. A system assembly comprising the backplane assembly of claim 4, wherein the backplane assembly is a first backplane assembly configured to electrically couple with the system assembly, the system assembly further comprising:
a second backplane assembly adjacent to the first backplane assembly and configured to electrically couple with the system assembly, the second backplane assembly comprising:
a third floating backplane connector,
a third backplane plate, with which the third floating backplane connector is coupled, movably coupled with a second chassis wall,
a pair of third stepped stoppers coupled to the second chassis wall and positioned on each lateral side of the third backplane plate, each third stepped stopper comprising a third step structure at a particular third distance from the second chassis wall and dividing each third stepped stopper into engaging and fully-mated portions, a fourth floating backplane connector,
a fourth backplane plate, with which the fourth floating backplane connector is coupled, movably coupled with the second chassis wall, and
a pair of fourth stepped stoppers coupled to the second chassis wall and positioned on each lateral side of the fourth floating backplane plate, each fourth stepped stopper comprising a fourth step structure at a particular fourth distance from the second chassis wall and dividing each fourth stepped stopper into engaging and fully-mated portions;
wherein the third distance of each third step structure is different from the fourth distance of each fourth step structure.

7. The backplane assembly of claim 1, wherein:
the first floating backplane connector assembly further comprises a pair of first guide stoppers coupled to the chassis wall and protruding through respective holes in the first backplane plate, each first guide stopper comprising a first stopper structure at a particular first position along each first guide stopper;
the second floating backplane connector assembly further comprises a pair of second guide stoppers coupled to the chassis wall and protruding through respective holes in the second backplane plate, each second guide stopper comprising a second stopper structure at a particular second position along each second guide stopper; and
a first distance between the chassis wall and the first position of each first stopper structure is different from a second distance between the chassis wall and the second position of each second stopper structure.

8. The backplane assembly of claim 7, wherein:
the first backplane plate is positioned, for engagement with a first backplane connector of a replaceable electronics module insertable into the chassis, on the engaging portion of each first stepped stopper between the first step structure of each first stepped stopper and the first stopper structure of each first guide stopper; and
the second backplane plate is positioned, for engagement with a second backplane connector of the electronics module, on the engaging portion of each second stepped stopper between the second step structure of each second stepped stopper and the second stopper structure of each second guide stopper.

9. The backplane assembly of claim 8, wherein:
the first distance corresponding to the first stopper structure is greater than the second distance corresponding to the second stopper structure, such that the first backplane connector of the electronics module engages with the corresponding first floating backplane connector before the second backplane connector of the electronics module engages with the corresponding second floating backplane connector.

10. The backplane assembly of claim 9, further comprising:
a fixed backplane connector coupled to the chassis wall via an attachment standoff configured such that a third backplane connector of the electronics module engages with the fixed backplane connector after the second backplane connector of the electronics module engages with the corresponding second floating backplane connector.

11. A method for incrementally interconnecting an electronics module with a backplane, the method comprising:

inserting, into a chassis of a backplane assembly, an electronics module comprising a first backplane electrical connector and a second backplane electrical connector, including first engaging the first backplane electrical connector with a corresponding first floating backplane connector assembly of the backplane assembly; and continuing inserting the electronics module further into the chassis, including subsequently engaging the second backplane electrical connector with a corresponding second floating backplane connector assembly of the backplane assembly.

12. The method of claim 11, wherein:

first engaging the first backplane electrical connector with the first floating backplane connector assembly includes engaging with the first floating backplane connector assembly comprising:

a first backplane plate movably coupled with a chassis wall and with which a first floating backplane connector is coupled, and a pair of first stepped stoppers coupled to the chassis wall and positioned on each lateral side of the first backplane plate, each first stepped stopper comprising a first step structure at a particular first distance from the chassis wall and dividing each first stepped stopper into a lower engaging portion and a higher fully-mated portion, wherein the first backplane plate is initially positioned adjacent to the first step structure and on the engaging portion of each first stepped stopper so that the first step structure provides a reactive force to the first backplane plate for engaging the first backplane connector with the corresponding first floating backplane connector; and subsequently engaging the second backplane electrical connector with the second floating backplane connector assembly includes engaging with the second floating backplane connector assembly comprising:

a second backplane plate movably coupled with the chassis wall and with which a second floating backplane connector is coupled, and a pair of second stepped stoppers coupled to the chassis wall and positioned on each lateral side of the second backplane plate, each second stepped stopper comprising a second step structure at a particular second distance from the chassis wall and dividing each second stepped stopper into a lower engaging portion and a higher fully-mated portion, wherein the second backplane plate is initially positioned adjacent to the second step structure and on the engaging portion of each second stepped stopper so that the second step structure provides a reactive force to the second backplane plate for engaging the second backplane connector with the corresponding second floating backplane connector.

13. The method of claim 12, wherein the first distance is greater than the second distance so that the first backplane connector engages with the first floating backplane connector before the second backplane connector of the electronics module engages with the second floating backplane connector.

14. The method of claim 11, wherein the backplane assembly further comprises a fixed backplane connector coupled to the chassis wall via a standoff, the method further comprising:

continuing inserting the electronics module further into the chassis, including subsequently engaging a third backplane electrical connector of the electronics module with the corresponding fixed backplane connector, wherein the standoff is configured so that the third backplane connector engages with the fixed backplane connector after the second backplane connector engages with the second floating backplane connector.

15. The method of claim 12, further comprising:

removing the electronics module from the chassis, including:

first disengaging the second backplane electrical connector from the second floating backplane connector assembly, and subsequently disengaging the first backplane electrical connector from the first floating backplane connector assembly.

16. The method of claim 15, wherein:

first disengaging the second backplane electrical connector from the second floating backplane connector assembly includes disengaging from the second floating backplane connector assembly comprising:

a pair of second guide stoppers coupled to the chassis wall and protruding through respective holes in the second backplane plate, each second guide stopper comprising a second stopper structure at a particular second position along each second guide stopper; and subsequently disengaging the first backplane electrical connector from the first floating backplane connector assembly includes disengaging from the first floating backplane connector assembly comprising:

a pair of first guide stoppers coupled to the chassis wall and protruding through respective holes in the first backplane plate, each first guide stopper comprising a first stopper structure at a particular first position along each first guide stopper;

wherein a first distance between the chassis wall and the first position of each first stopper structure is different from a second distance between the chassis wall and the second position of each second stopper structure.

17. The method of claim 16, wherein:

first disengaging the second backplane electrical connector from the second floating backplane connector assembly further includes positioning the second backplane plate on the engaging portion of each second stepped stopper between the second step structure of each second stepped stopper and the second stopper structure of each second guide stopper; and subsequently disengaging the first backplane electrical connector from the first floating backplane connector assembly further includes positioning the first backplane plate on the engaging portion of each first stepped stopper between the first step structure of each first stepped stopper and the first stopper structure of each first guide stopper.

18. An electronics backplane assembly comprising:

a first backplane connector assembly comprising first means for temporarily positioning a corresponding movable first backplane connector for engagement with a first mating connector of a replaceable electronics module insertable into a chassis to which the first backplane connector assembly is coupled; and a second backplane connector assembly comprising second means for temporarily positioning a corresponding movable second backplane connector for engagement with a second mating connector of the electronics module insertable into the chassis to which the second backplane connector assembly is coupled;

wherein the first means and the second means are con-
figured so that the first mating connector of the elec-
tronics module engages with the corresponding first
backplane connector before the second mating connec-
tor of the electronics module engages with the corre-
sponding second backplane connector.

19. The electronics backplane assembly of claim 18,
further comprising:
means for positioning a fixed backplane connector
coupled to the chassis wall so that a third mating
connector of the electronics module engages with the
fixed backplane connector after the second mating
connector of the electronics module engages with the
corresponding second backplane connector.

20. The system assembly of claim 6, wherein:
the third floating backplane connector is configured the
same as the first floating backplane connector;
the third backplane plate is configured the same as the first
backplane plate;
the pair of third stepped stoppers is configured the same
as the pair of first stepped stoppers;
the fourth floating backplane connector is configured the
same as the second floating backplane connector;
the fourth backplane plate is configured the same as the
second backplane plate; and
the pair of fourth stepped stoppers is configured the same
as the pair of second stepped stoppers.

\* \* \* \* \*